United States Patent [19]

Lance et al.

[11] 4,035,736

[45] July 12, 1977

[54] FM DISCRIMINATOR HAVING LOW NOISE CHARACTERISTICS

[75] Inventors: Drew R. Lance, Saratoga; John E. Altstatt, Palo Alto, both of Calif.

[73] Assignee: California Microwave, Inc., Sunnyvale, Calif.

[21] Appl. No.: 656,534

[22] Filed: Feb. 9, 1976

[51] Int. Cl.² .................................. H03D 3/00
[52] U.S. Cl. .................. 329/122; 331/2; 331/19
[58] Field of Search ........... 331/2, 11, 19; 329/122; 332/19

[56] References Cited

U.S. PATENT DOCUMENTS 3,600,683  8/1971  Martin ................................. 331/11

Primary Examiner—John Kominski

Attorney, Agent, or Firm—Boone, Schatzel, Hamrick & Knudsen

[57] ABSTRACT

A low noise discriminator circuit having particular utility for use in determining the spectral purity characteristics of an rf signal source and comprising, in addition to standard discriminator components, a downlocked reference signal source including a voltage-controlled signal generator for developing a reference signal and a corresponding train of signal pulses, a stabilizing voltage-controlled oscillator which responds to the discriminator error signal and generates a stabilizing signal having a frequency at least an order of magnitude greater than the frequency of the reference signal, and a sampling phase detector which samples the stabilizing signal at the signal pulse frequency and develops a control signal which is fed through a feed-back loop to stabilize the reference signal generator.

10 Claims, 2 Drawing Figures

FM DISCRIMINATOR HAVING LOW NOISE CHARACTERISTICS

BACKGROUND OF THE INVENTION

1. Field of the Invention

The present invention relates generally to discriminator apparatus and more particularly, to an improved low noise phase lock discriminator circuit having particular utility for use in testing the spectral purity of rf signals.

2. Description of the Prior Art

Phase-locked circuits have long been used for various purposes in the communications industry as evidenced by the U.S. Pat. Nos. to Sui, 3,624,511; Brooks, 3,316,497; Widl, 3,287,657; Gruen, 2,838,419; Hileman, 3,363,194; Deman, 3,320,544; Perkins et al., 3,495,184; Taylor, 3,421,105; and Haggai, 3,611,168. However, the field of use of such circuits is limited to certain applications unless very sophisiticated reference sources are used to insure that the reference noise is low. For example, an ordinary phase-locked circuit is not suitable for use in making highly accurate measurements of the spectral purity of an rf signal because the sensitivity of the apparatus is limited by the inherent noise characteristics of the detector reference source.

SUMMARY OF THE INVENTION

It is therefore a primary object of the present invention to provide an improved phase lock discriminator including a reference signal source having extremely low noise characteristics.

Another object of the present invention is to provide a low noise phase lock discriminator using relatively inexpensive and readily available circuit components.

Briefly, the present invention is directed to a phase lock discriminator circuit in which the reference source includes a voltage-controlled reference signal generator that is phase-locked to a more stable, higher frequency, voltage-controlled oscillator through a sampling phase detector and feed-back circuit. The stabilizing oscillator output signal is sampled at the rate of the lower frequency signal generator and any change in phase between successive samplings causes an error voltage to be generated which is fed through the feed-back circuit to the voltage control input of the signal generator to keep the signal generator in synchronization with the stabilizing oscillator. In this manner, the better stability of the high frequency oscillator is impressed upon the lower frequency signal generator thereby causing it to develop a reference signal having extremely low noise power.

A principal advantage of the present invention is that it utilizes readily-available electronic components to provide a low-noise phase lock discriminator having a signal purity measuring capability which is substantially better than that of prior art apparatus.

Other objects and advantages of the present invention will no doubt become apparent to those skilled in the art after having read the following detailed description of a preferred embodiment which is illustrated in the drawing.

IN THE DRAWING

FIG. 1 is a block diagram illustrating a preferred embodiment of a discriminator circuit in accordance with the present invention; and FIG. 2 is a block diagram illustrating the principal components of the voltage-controlled signal generator shown in FIG. 1.

DETAILED DESCRIPTION OF THE PREFERRED EMBODIMENT

Figure 1:
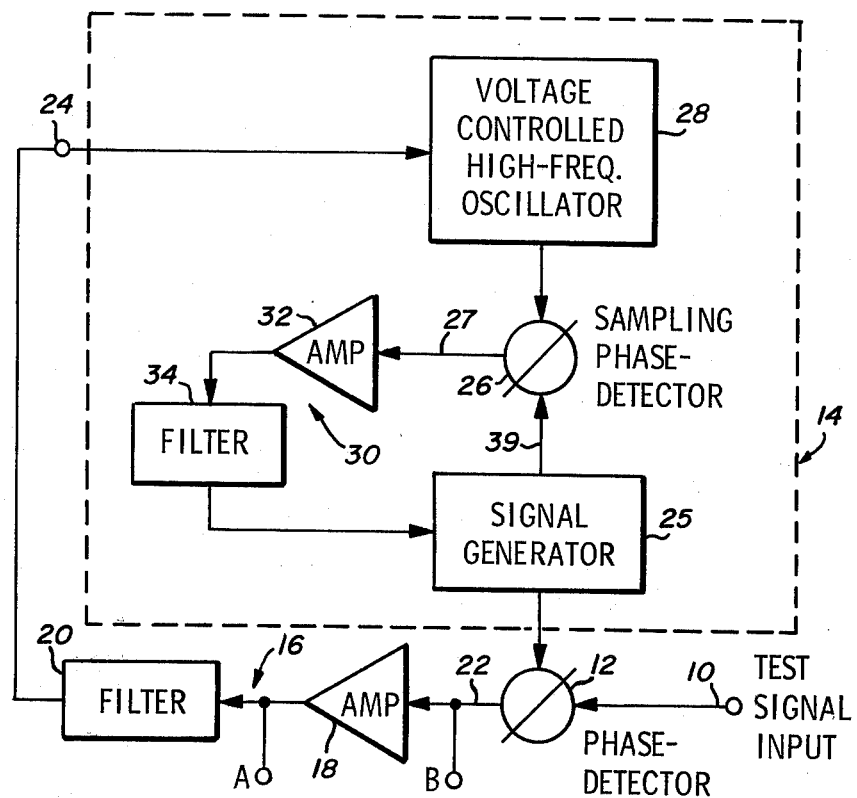

Referring now to FIG. 1 of the drawing, there is shown a phase lock discriminator in accordance with a preferred embodiment of the present invention which includes a test signal input terminal 10, a phase detector 12, a down-locked reference source 14, a feed-back loop 16 including an amplifier 18 and a filter 20, and a pair of discriminator output terminals A and B. Phase detector 12 compares the phase of the reference signal generated by reference source 14 to the phase of the test signal input at terminal 10. Any resulting error signal developed by detector 12 at output 22 is amplified and filtered by feed-back loop 16 and then applied to the voltage control input 24 of reference source 14.

In the preferred embodiment, a double balanced mixer is used for the phase detector 12. Detector 12 mixes the reference signal and the test signal input at terminal 10 from an apparatus to be evaluated, and develop an error signal proportional to any difference in phase between the respective signals. The error signal developed by detector 12 is substantially linear with respect to the phase difference between the two signals so long as the difference does not exceed ± 10°. Amplified and unamplified output signals indicative of a particular dynamic characteristic of the apparatus generating the test signal may be taken at terminals A and B respectively. If the apparatus under test is caused to experience calibrated signal deviation, the output developed at terminals A and B will indicate the spectral purity of the signal developed by that apparatus.

Reference source 14 is comprised of a voltage-controlled signal generator 25 which operates at the test signal frequency, a sampling phase detector 26, an oscillator 28 which operates at a frequency substantially higher than the test frequency, and a feed-back circuit 30 including an amplifier 32 and a low pass filter 34.

Figure 2:
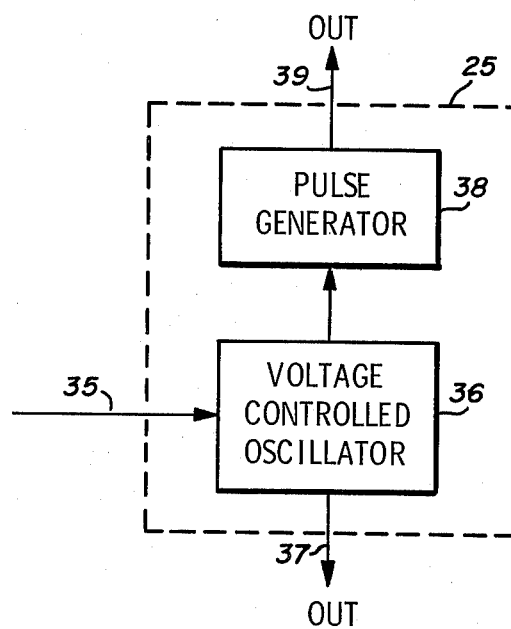

As illustrated in FIG. 2 of the drawing, signal generator 25 is typically comprised of a voltage-controlled oscillator 36 which generates a sinusoidal reference signal on line 37, and a pulse generator 38 which uses the output of oscillator 36 to develop a train of signal pulses on line 39. In the preferred embodiment oscillator 36 is a voltage-controlled L-C device which is operative over a frequency range of between 30 mHz and 75 mHz. Pulse generator 38 is a pulse forming network which develops one pulse of very short duration, e.g., on the order of a few pico seconds, for every cycle of the signal generated by oscillator 36. Alternatively, generator 38 could be caused to develop more than or less than one pulse per cycle of the reference signal. In such case, the frequency of oscillator 28 would have to be appropriately selected as indicated below.

The stabilizing oscillator 28 in a preferred embodiment is an L-band cavity oscillator or a slab-line oscillator which operates in a high frequency range normally 10 to 100 times that of oscillator 36. Oscillator 28 must be capable of generating a constant amplitude sinusoid of a frequency which is an integral multiple of the frequency of the signal generated by oscillator 36 so that the less stable oscillator 36 can be synchronized with the more stable oscillator 38 and thus be regulated by it.

Sampling phase detector 26 is an apparatus of the type which samples one signal input at a rate determined by another signal input thereto and develops an error signal proportional to any change in relative phase of the two input signals between successive samples. More particularly, in a preferred embodiment detector 26 samples the sinusoidal stabilizing signal output of oscillator 28 during the extremely short duration of the pulses of the pulse signal generated by generator 38 and develops an error signal at 27 which follows any change in amplitude of the sampled portion of the high frequency sinusoid. Although the error signal is sinusoidal over the full range of phase differences, it varies substantially linearly with change in phase between successive samplings as long as the phase difference between the stabilizing signal and the pulse signal does not exceed ±10°. The output can therefore be calibrated to indicate certain particulars of the signal being tested.

Amplifier 32 and filter 34, although shown as discrete circuit components, can be consolidated in an active filter embodiment using operational amplifier techniques. These elements serve to set the loop bandwidth of the feed-back circuit 30 and are typically chosen to provide a loop bandwidth of approximately 200 kHz.

In utilizing the improved discriminator of the present invention, reference source 14 is initially adjusted to produce a reference signal at the operating frequency of the apparatus to the tested. This is accomplished by adjusting signal generator 25 to operate at the desired frequency and by adjusting oscillator 28 to operate at a higher frequency which, as indicated above, is typically between 10 and 100 times the operating frequency of generator 25. Sampling phase detector 26 is then caused to sample the stabilizing signal at the pulse signal frequency and develop an error signal for controlling the frequency of generator 25. The resultant down-locking or synchronization of signal generator 25 to oscillator 28 causes the frequency stability and thus the noise power of signal generator 25 to be improved by a factor roughly equivalent to the ratio of the stabilizing signal frequency to the reference signal frequency. In a preferred embodiment, this amounts to at least a 10 dB noise improvement over corresponding prior art apparatus.

The output signal developed by the apparatus under test is then applied to test signal input terminal 10 and any phase difference between it and the reference signal will cause detector 12 to develop an error signal at 22, which after amplification and filtering in feed-back loop 16 is fed to the control input of stabilizing oscillator 28. This causes a shift in the phase of the stabilizing signal which in turn causes the phase of the reference signal developed by generator 25 to follow and synchronize with the test signal. If thereafter a dynamic change is caused to occur in the operation of the apparatus under test, the consequent error signal developed by detector 12 may be taken at terminal A or B and will be indicative of the response of the apparatus to the imposed operational change.

Whereas the present invention has been described with reference to a single preferred embodiment, it will be appreciated the certain alterations and modifications will be apparent to those skilled in the art after having read the preceding disclosure. Accordingly, it is intended that the appended claims be interpreted as covering all such alterations and modifications as fall within the true spirit and scope of the invention.

What is claimed is:

1. In a discriminator including a voltage-controlled reference source for generating a reference signal, a detector for comparing the phase of an input test signal to the phase of the reference signal and for generating an error signal commensurate with any difference therebetween, and a feed-back circuit for coupling the error signal to the control input of the reference source, an improved reference source comprising:
    voltage-controlled signal generating means responsive to a control signal and operative to generate a reference signal of a first frequency;
    first voltage-controlled oscillator means responsive to the error signal and operative to develop a stabilizing signal having a second frequency which is at least an order of magnitude greater than said first frequency;
    phase detector means for comparing the phase of said reference signal to the phase of said stabilizing signal and for developing an error signal commensurate with any difference therebetween; and
    feed-back circuit means for coupling said error signal to said signal-generating means for causing the phase of said reference signal to follow the phase of said stabilizing signal.

2. In a discriminator as recited in claim 1 wherein said signal generating means includes a second voltage-controlled oscillator means responsive to said error signal and operative to generate said reference signal, and a pulse generator responsive to said reference signal and operative to generate a pulse signal of a frequency corresponding to that of said reference signal.

3. In a discriminator as recited in claim 2 wherein said phase detector means is a sampling phase detector responsive to said pulse signal and operative to sample said stabilizing signal at the frequency of said pulse signal and to develop said error signal.

4. In a discriminator as recited in claim 2 wherein said second oscillator means includes an L-C oscillating circuit.

5. In a discriminator as recited in claim 1 wherein said first oscillator means includes an L-band cavity oscillator.

6. In a discriminator as recited in claim 5 wherein said L-band cavity oscillator has an operating frequency at least one order of magnitude greater than the operating frequency of said signal-generating means.

7. In a discriminator as recited in claim 1 wherein said first oscillator means includes a slab-line oscillator.

8. In a discriminator as recited in claim 7 wherein said slab-line oscillator has an operating frequency at least one order of magnitude greater than the operating frequency of said signal-generating means.

9. In a discriminator as recited in claim 1 wherein said first oscillator means operates at a frequency at least 10 times that of the frequency of said reference signal, and wherein said signal-generating means includes a second voltage-controlled oscillator means responsive to said control signal and operative to generate said reference signal.

10. In a discriminator as recited in claim 9 wherein said signal-generating means operates over the frequency band of from 30 to 75 mHz.

* * * * *